United States Patent
Navarro et al.

(10) Patent No.: US 7,332,048 B2
(45) Date of Patent: Feb. 19, 2008

(54) FORMING AND BONDING OF FLEX CIRCUITS TO STRUCTURES

(75) Inventors: Julio Navarro, Kent, WA (US); Richard N Bostwick, North Bend, WA (US); Mark S Bolster, Fall City, WA (US)

(73) Assignee: The Boeing Company, Chicago, IL (US)

(*) Notice: Subject to any disclaimer, the term of this patent is extended or adjusted under 35 U.S.C. 154(b) by 551 days.

(21) Appl. No.: 10/991,291

(22) Filed: Nov. 17, 2004

(65) Prior Publication Data
US 2006/0105620 A1 May 18, 2006

(51) Int. Cl.
*B32B 37/00* (2006.01)
*B29C 65/00* (2006.01)

(52) U.S. Cl. .............. 156/212; 156/226; 156/227; 156/307.7

(58) Field of Classification Search ............ 156/212, 156/213, 216, 226, 227, 307.1, 307.7, 475, 156/483, 484; 257/688; 174/254; 361/749; 439/67
See application file for complete search history.

(56) References Cited

U.S. PATENT DOCUMENTS

| | | | |
|---|---|---|---|
| 3,943,031 A * | 3/1976 | Krueger et al. | 156/583.1 |
| 5,118,375 A * | 6/1992 | Malachowski et al. | 156/216 |
| 5,925,298 A * | 7/1999 | Walles et al. | 264/139 |
| 6,424,313 B1 | 7/2002 | Navarro et al. | |
| 6,504,724 B2 | 1/2003 | Serizawa et al. | |
| 6,617,510 B2 | 9/2003 | Schreiber et al. | |
| 6,687,969 B1 | 2/2004 | Dando | |
| 6,698,091 B1 | 3/2004 | Heston et al. | |
| 6,700,052 B2 | 3/2004 | Bell | |
| 6,718,815 B2 | 4/2004 | Fantini | |
| 6,749,459 B2 | 6/2004 | Urbaniak et al. | |
| 6,750,539 B2 | 6/2004 | Haba et al. | |

OTHER PUBLICATIONS

IBM Technical Disclosure Bulletin titled "Concept for Forming Multilayer Structures for Packaging" published Aug. 1987.*
Rogers Corporation Data Sheet, "RT/duroid® 5870/5880 High Frequency Laminates", Mar. 2003, 4 pgs.

* cited by examiner

*Primary Examiner*—John L. Goff
(74) *Attorney, Agent, or Firm*—Harness, Dickey & Pierce, P.L.C.

(57) ABSTRACT

An apparatus and method for forming and bonding of flexible circuits to metal structures includes a clamping frame having a removable frame portion. At least one flexible roller fixture provides opposed flexible rollers. A clearance aperture in the roller fixture is sized to slidably receive the clamping frame. As the clamping frame is inserted through the clearance aperture of the roller fixture the opposed flexible rollers apply a continuous pressure to deflect the flexible circuit. A curing clamp is then connected to the clamping frame having at least one engagement face defining a flexible circuit finished shape. The flexible circuit is then heat cured to adhesively bond to the metal structure.

16 Claims, 7 Drawing Sheets

FORMING AND BONDING OF FLEX CIRCUITS TO STRUCTURES

GOVERNMENT RIGHTS

This invention was made with government support provided by DUST/USAT under the terms of Contract No. USAT #N6601-99-C-6001. The government has certain rights in the invention.

FIELD OF THE INVENTION

The present invention relates in general to flexible electric circuits and more specifically to a device and method for forming and bonding flexible circuits to structures.

BACKGROUND OF THE INVENTION

Flexible circuits of various designs are known, in particular for low frequency or direct current applications. For example, commercially available flexible circuit strips such as used for computer printers are generally available in polyimide material film form such as KAPTON® material in thicknesses ranging from about 0.005 cm (0.002 in) to 0.013 cm (0.005 in). These flexible circuit strips are generally good for direct current applications where flex cracking of the metallized circuit lines can be accommodated without loss of signal capability. The material of these flexible circuits is more expensive in the thicker material form necessary for use when greater separation of metallization lines for alternating current or radio frequency or higher frequency signals are transferred. For example, the dielectric constant of KAPTON® material when metallization circuitry lines are closely laid for use in high frequency applications is particularly undesirable and produces higher signal loss.

In addition to the material considerations noted above, for applications in the X, Ku, K and Ka frequency bands, or when wireless communication signals generated for transmission or reception using phased array antennas are involved, it is often desirable to bond the flexible circuit(s) to a host device. Commercially available flexible circuits having an adhesive backing are generally unacceptable when formed and bonded to relatively small radii multi-conductor modules such as for phased array antenna applications. Commercially available multi-layer flexible circuits are also generally unacceptable for higher frequency use. When multi-layer flexible circuits are required, known systems suffer from cracking and signal crosstalk problems when used or bent to radii needed for the higher frequency small bend radii applications.

SUMMARY OF THE INVENTION

According to a preferred embodiment of the present invention, an apparatus and method for forming and bonding of flex circuits to structures includes a clamping frame having a removable frame portion. At least one flexible roller fixture provides opposed flexible rollers. A clearance aperture in the roller fixture is sized to slidably receive the clamping frame. The clamping frame holds both the metal structure and the flexible circuit. The clamping frame is inserted through the clearance aperture of the roller fixture until the opposed flexible rollers deflect the flexible circuit. A curing clamp is then releasably connected to the clamping frame. The curing clamp has at least one engagement face defining a finished shape of the flexible circuit. The curing clamp and engagement face engages with the flexible circuit to create the flexible circuit finished shape. The flexible circuit is retained in the curing clamp and heat cured to adhesively bond to the metal structure.

Another preferred method conformally bonds a flexible circuit to a substrate with a heat-curable adhesive. The circuit is positioned over the substrate so that the adhesive will bond the two together. A clamp holds the circuit in the desired position and configuration. The clamp is itself fitted into a frame that presses the circuit against the substrate. Then, the entire assembly is heated in an oven to cure the adhesive and to bond the circuit to the substrate.

According to still another preferred embodiment of the present invention, a method is provided for using a device to conform and bond at least one flexible circuit to an electronic module. The device has a clamping frame, first and second flexible roller fixtures, and at least one curing clamp. The method includes mounting both the electronic module and the flexible circuit into the clamping frame. A first end of the clamping frame is inserted through the first flexible roller fixture. A second end of the clamping frame is directed into the second flexible roller fixture. The curing clamp is connected to the clamping frame. The flexible circuit and the electronic module are heat cured to adhesively bond the flexible circuit to the electronic module.

An apparatus and method for forming and bonding of flexible circuits to metal structures of the present invention provides several advantages. By clamping an adhesively backed flexible circuit to the metal structure, a repeatable and accurate bond can be formed. By closely controlling a shape of the clamp and a receiving flexible roller fixture, the bending radius of the flexible circuit is controlled to reduce cracking. By using flexible polymeric material for rollers of the roller fixture, the flexible circuits can be rolled with minimal cracking. A clamp frame of the present invention having a predefined or finished shape of the metal structure formed thereon eliminates spring-back of the flexible circuit following bending by the roller fixture and holds the flexible circuit against the metal structure during a subsequent heat curing process to improve the bond of the flexible circuit to the metal structure.

The features, functions, and advantages can be achieved independently in various embodiments of the present invention or may be combined in yet other embodiments.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Figure 1:
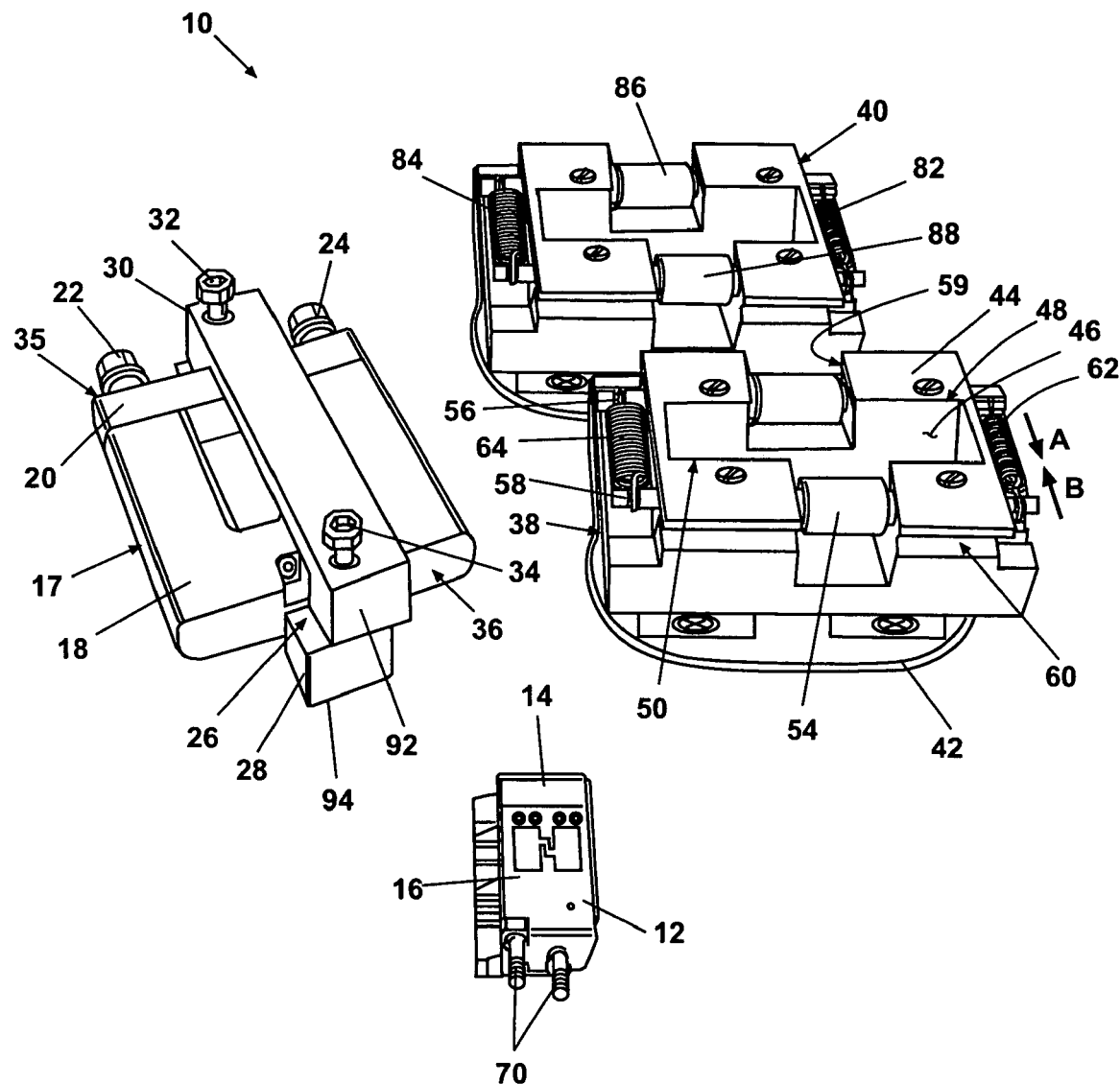
FIG. 1 is a perspective view showing a device for forming and bonding of flex circuits to structures according to a preferred embodiment of the present invention.

According to a preferred embodiment of the present invention and generally referring to FIG. 1, a flexible circuit forming apparatus 10 for forming and bonding of flexible circuits to structures is operable to form a first flexible circuit 12 and a second flexible circuit 14 about a mandrel 16. Mandrel 16 can have multiple shapes and provides an exemplary envelope for supporting at least the first flexible circuit 12 and optionally the second flexible circuit 14. In one embodiment, mandrel 16 is an element of a phased array antenna module.

Mandrel 16 is clamped within a clamping frame 17 during the various processes of the present invention. Clamping frame 17 includes a U-shaped clamping member 18 which generally holds the mandrel 16 within it, and a clamping bar 20, which is fastenably connected to U-shaped clamping member 18 using each of a first and a second clamp fastener 22, 24. Clamping frame 17 is substantially equal to or narrower than mandrel 16 to permit bending of first and second flexible circuits 12, 14 about mandrel 16.

A curing clamp 26 is connected to clamping frame 17 during a further process according to the present invention. Curing clamp 26 includes a first member 28 and a second member 30, which are fastenably clamped about U-shaped clamping member 18 using each of a first curing clamp fastener 32 and a second curing clamp fastener 34. Clamping frame 17 also includes a first end face 35 and a second end face 36.

Flexible circuit forming apparatus 10 also includes a first flexible roller assembly 38 and optionally a second flexible roller assembly 40. First and second flexible roller assemblies 38, 40 include the same or substantially similar component elements, therefore first flexible roller assembly 38 will be further described herein and its description applies equally to that of second flexible roller assembly 40. First flexible roller assembly 38 includes a base 42 which fastenably supports a receiving member 44. Receiving member 44 provides an aperture 46 which is formed through an entire thickness of receiving member 44. Aperture 46 according to a preferred embodiment of the present invention is provided in a substantially rectangular shape to slidingly receive each of the first end face 35 and the second end face 36, respectively, of clamping frame 17. Aperture 46 includes a first aperture engagement edge 48 and a second aperture engagement edge 50.

First flexible roller assembly 38 also includes a first flexible roller 52 and a second flexible roller 54. First flexible roller 52 is rotatably mounted on a first roller pin 56. Similarly, second flexible roller 54 is rotatably mounted on a second roller pin 58. First roller pin 56 is slidably disposed within a pin receiving slot 59 formed adjacent to first aperture engagement edge 48. A pin receiving slot 60 is similarly created adjacent second aperture engagement edge 50 to slidably receive second roller pin 58. First and second roller pins 56, 58 are biased toward each other by each of a first biasing element 62 and a second biasing element 64. First and second biasing elements 62, 64 bias first and second roller pins 56, 58 in each of a first roller bias direction "A" and a second roller bias direction "B", respectively.

First and second flexible rollers 52, 54 are "flexible" in at least two ways. First, flexibility is provided by their ability to deflect outwardly from the position shown in FIG. 1 against the biasing force of first and second biasing elements 62, 64. Second, each of first and second flexible rollers 52, 54 are preferably provided from an elastically deflectable material. In one preferred embodiment, first and second flexible rollers 52, 54 are made from a 50 durometer, high density polyurethane material. This permits surface or metallization areas of first or second flexible circuits 12,14 to be contacted by the material of first or second flexible rollers 52,54 without damaging the flexible circuits.

In one preferred embodiment, the material used for clamping frame 17 includes a stainless steel for each of U-shaped clamping member 18 and clamping bar 20. Mandrel 16 is a metal such as aluminum. Material for curing clamp 26 is preferably provided of the same material as mandrel 16 such that both mandrel 16 and curing clamp 26 have the same co-efficient of thermal expansion, for reasons that will be described further herein. The base material for first and second flexible circuits 12, 14 is preferably a fluoropolymer material such as polytetrafluoroethylene (PTFE) including Teflon® material available from the Rogers Corporation of Chandler, Arizona, as Rogers Part Number 5880. In one embodiment of the present invention, first and second flexible circuits 12, 14 have a dielectric constant of approximately 2.2 and a thickness ranging from approximately 0.013 cm (0.005 inch) to approximately 0.127 cm (0.050 inch). The invention is not limited to a particular thickness or material for first or second flexible circuits 12, 14. For example, first and second flexible circuits 12, 14 can also be provided of a polyimide material such as Kapton® material which is commonly used for flexible circuits known in the art. Each circuit 12, 14 is also provided with a plurality of metallization lines (not shown) typically formed of a copper material and used for transmission of electrical signals. An exemplary configuration for first and second flexible circuits 12, 14 of Kapton® is provided in U.S. Pat. No. 6,424,313 issued Jul. 23, 2002 commonly assigned to the Assignee of the present invention, which is incorporated herein by reference. One or more layers of material can be used to form flexible circuits 12, 14.

Materials used for first and second flexible roller assemblies 38, 40 of the present invention are preferably selected of a material resistant to galling when clamping frame 17 is inserted therein. An exemplary material for first and second flexible roller assemblies 38, 40 includes but is not limited to brass. Materials for first and second biasing elements 62, 64 include spring steel and alternate materials available for biasing elements of this type. Material for first and second roller pins 56, 58 can be a steel material such as stainless steel.

Figure 2:
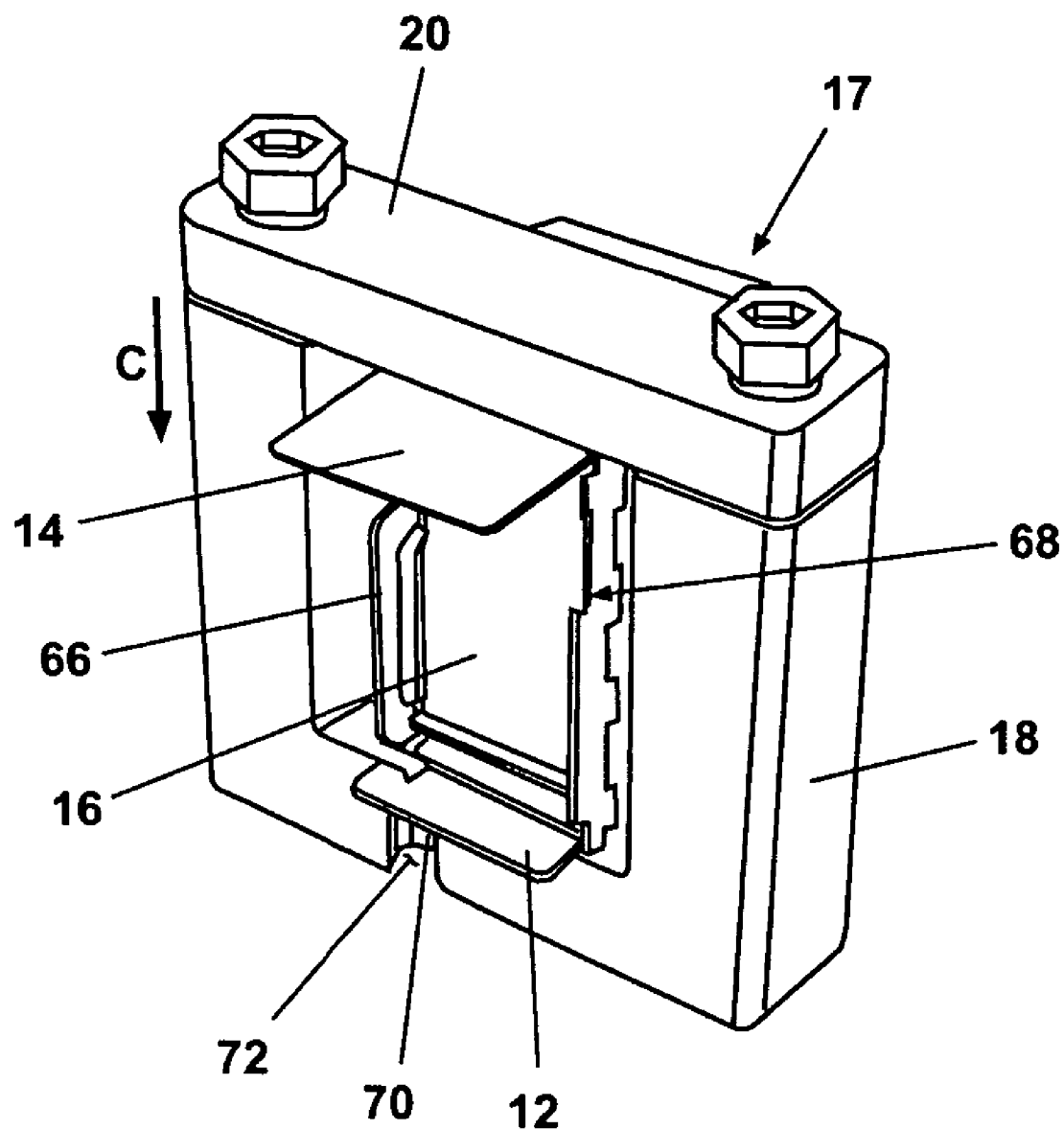
FIG. 2 is a perspective view of a clamping frame having a mandrel and an opposed pair of flexible circuits clamps therein.
Figure 3:
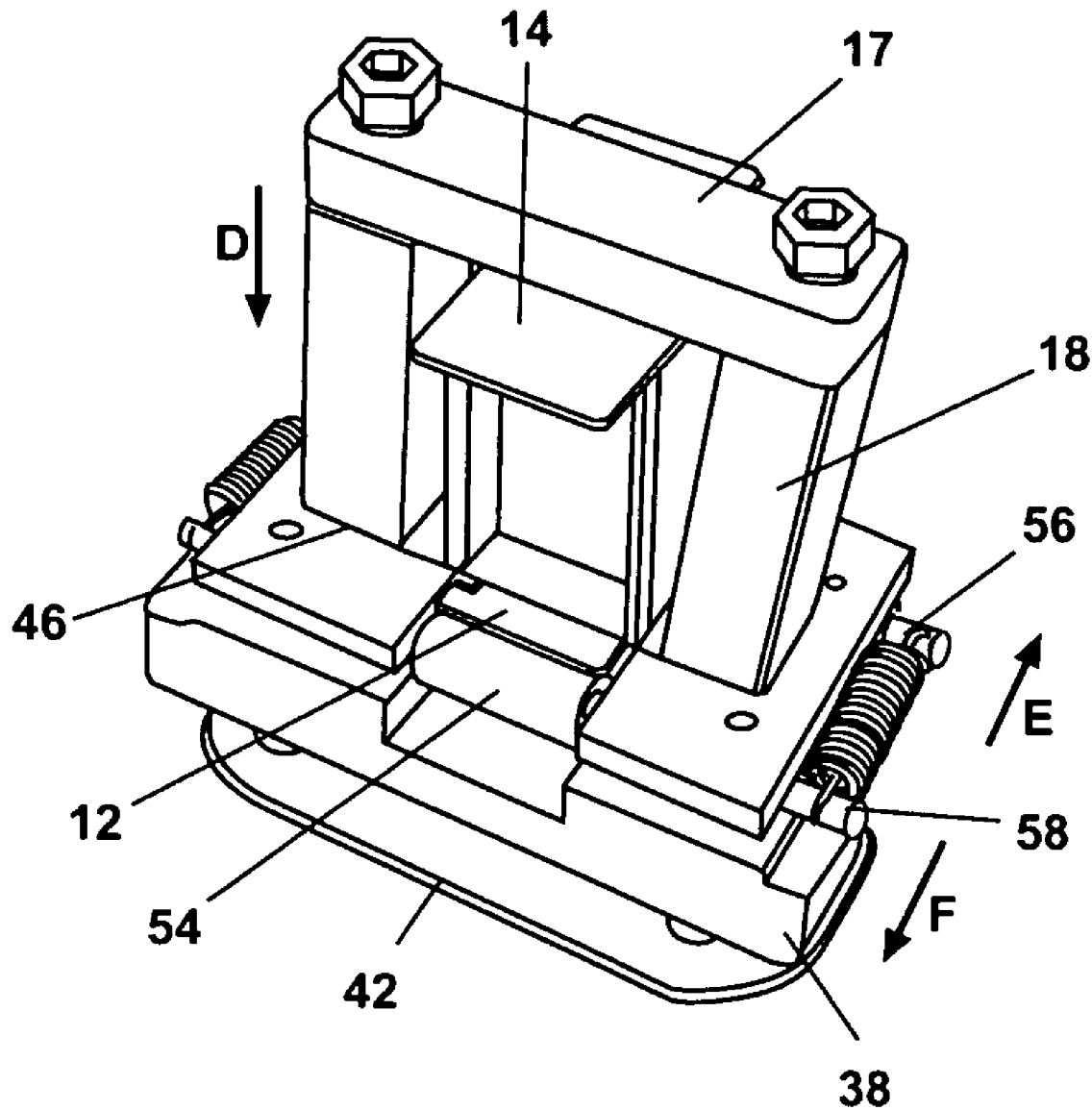
FIG. 3 is a perspective view showing the clamping frame partially inserted within a first flexible roller assembly of the present invention.
Figure 4:
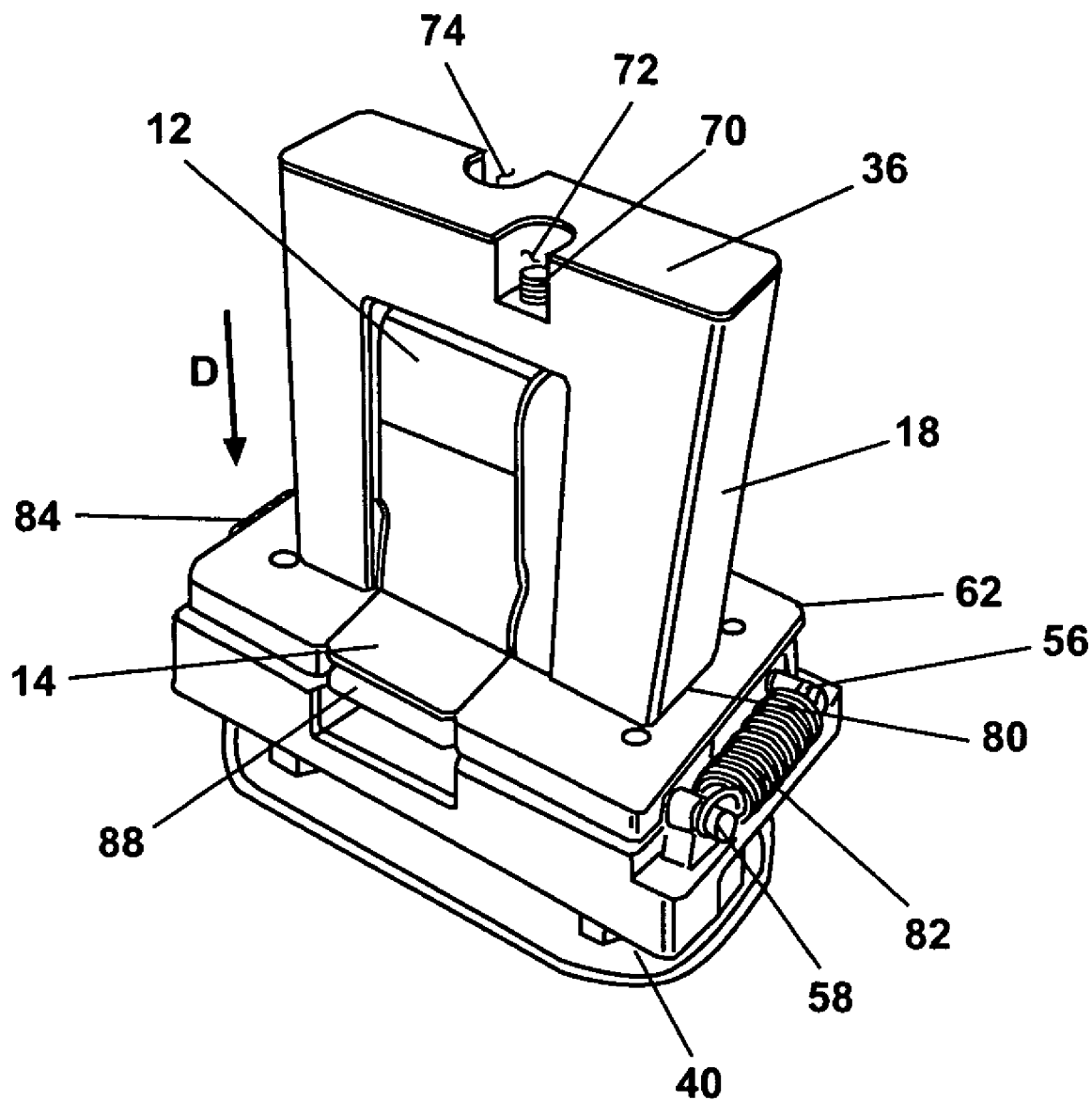
FIG. 4 is a perspective view showing the clamping frame reversed from the orientation shown in FIG. 3 and partially inserted into a second flexible roller assembly of the present invention.

Referring next to FIG. 2, each of first and second flexible circuits 12, 14 are shown in a clamped position relative to clamping frame 17 and prior to deformation by either first or second flexible roller assemblies 38, 40. Mandrel 16 is clamped between each of first and second flexible circuits 12, 14, U-shaped clamping member 18 and clamping bar 20, respectively. Clamping bar 20 provides a clamping force in the direction of arrow "C" suitable to retain each of mandrel 16 and first and second flexible circuits 12, 14 in the positions shown. Mandrel 16 further includes each of a mandrel first shaping surface 66 and a mandrel second shaping surface 68. Mandrel first and second shaping surfaces 66, 68 provide the desired finished shape of first and second flexible circuits 12, 14 following the operations to be described further herein.

Referring generally to FIGS. 1 through 4, operation of flexible circuit forming apparatus 10 is as follows. Initially, first and second flexible circuits 12, 14 are preheated to approximately 66° C. (150° F.) to soften the adhesive layer pre-applied to a face of both flexible circuits which allows the flexible circuits to be bonded to mandrel 16. In a first process, mandrel 16 is connected to U-shaped clamping member 18 by first positioning first flexible circuit 12 as shown in FIG. 2 against U-shaped clamping member 18 and directing each of a pair of mounting pins 70 of mandrel 16 through U-shaped clamping member 18 via each of a first and second counter bore 72, 74. A nut or similar fastening device is connected to each of mounting pins 70 to fastenably secure mandrel 16 and first flexible circuit 12 to U-shaped clamping member 18. Second flexible circuit 14 is then positioned as shown in FIG. 2 and clamping bar 20 is positioned over second flexible circuit 14 and tightened in clamping force direction "C" using each of first and second clamp fasteners 22, 24.

The subassembly shown in FIG. 2 is then positioned such that second end face 36 of U-shaped clamping member 18 is aligned with and pressed into aperture 46 of first flexible roller assembly 38 in an insertion direction "D". As U-shaped clamping member 18 is inserted further into aperture 46, first flexible circuit 12 engages each of first and second flexible rollers 52, 54 (only second flexible roller 54 is clearly shown in FIG. 3). Further displacement in the insertion direction "D" deflects first flexible circuit 12 about the predefined shape of mandrel 16. During this procedure, first roller pin 56 having first flexible roller 52 is deflected in a pin deflection direction "E". Similarly, second flexible roller 54 on second roller pin 58 is deflected generally in a pin deflection direction "F".

A spring constant of each of first and second biasing elements 62, 64 is predefined to maintain a bending force on first flexible circuit 12. The relatively softer material of first and second flexible rollers 52, 54 permit bending of first flexible circuit 12 without damaging the metallization layers of first flexible circuit 12 and without cracking the polymeric material of first flexible circuit 12. In one preferred embodiment of the present invention, a spring force for first and second biasing elements 62, 64 ranges from approximately 8 to 25 pounds per inch. The spring force can be varied from this range depending on, for example, the material selected for biasing elements 62,64, the amount of deflection of first and second flexible rollers 52,54, the materials/thicknesses of the flexible circuits or by varying a spring length and/or a spring diameter of biasing elements 62,64. Biasing elements 62,64 can also be provided by other devices (not shown) such as elastic members (for example O-rings) or pneumatic or hydraulic pressure devices. The selection of the biasing element type depends on many factors including the quantity and size of parts to be formed, the material/thickness to be bent and therefore the bending force required, a total cost desired for the equipment and the availability of air or hydraulic fluids. The use of coiled springs for biasing elements 62,64 is therefore intended for exemplary purposes only and is not intended to limit the invention.

If second flexible circuit 14 is to be used on mandrel 16, and if second flexible circuit 14 is not aligned for proper operation of first flexible roller assembly 38, second flexible roller assembly 40 is used. Once first flexible circuit 12 is bent about mandrel 16, clamping frame 17 is removed from first flexible roller assembly 38 and rotated 180° to the position shown in FIG. 4 adjacent second flexible roller assembly 40. First end face 35 of clamping frame 17 is aligned with an aperture 80 of second flexible roller assembly 40 and is inserted in the insertion direction "D". Because second flexible circuit 14 can have a different geometry than first flexible circuit 12, some of the component parts of second flexible roller assembly 40 are re-numbered as follows. A third biasing element 82 and a fourth biasing element 84 are substantially similar to each of first and second biasing elements 62, 64. A third flexible roller 86 and a fourth flexible roller 88 are substantially similar to first and second flexible rollers 52, 54 respectively. A spring force of third and fourth biasing elements 82, 84 is similar to the spring force of biasing elements 62,64, and predetermined for the size and/or bend radius for second flexible circuit 14. Clamping frame 17 is then fully inserted in aperture 80 in the insertion direction "D" to bend second flexible circuit 14 about mandrel 16.

Figure 5:
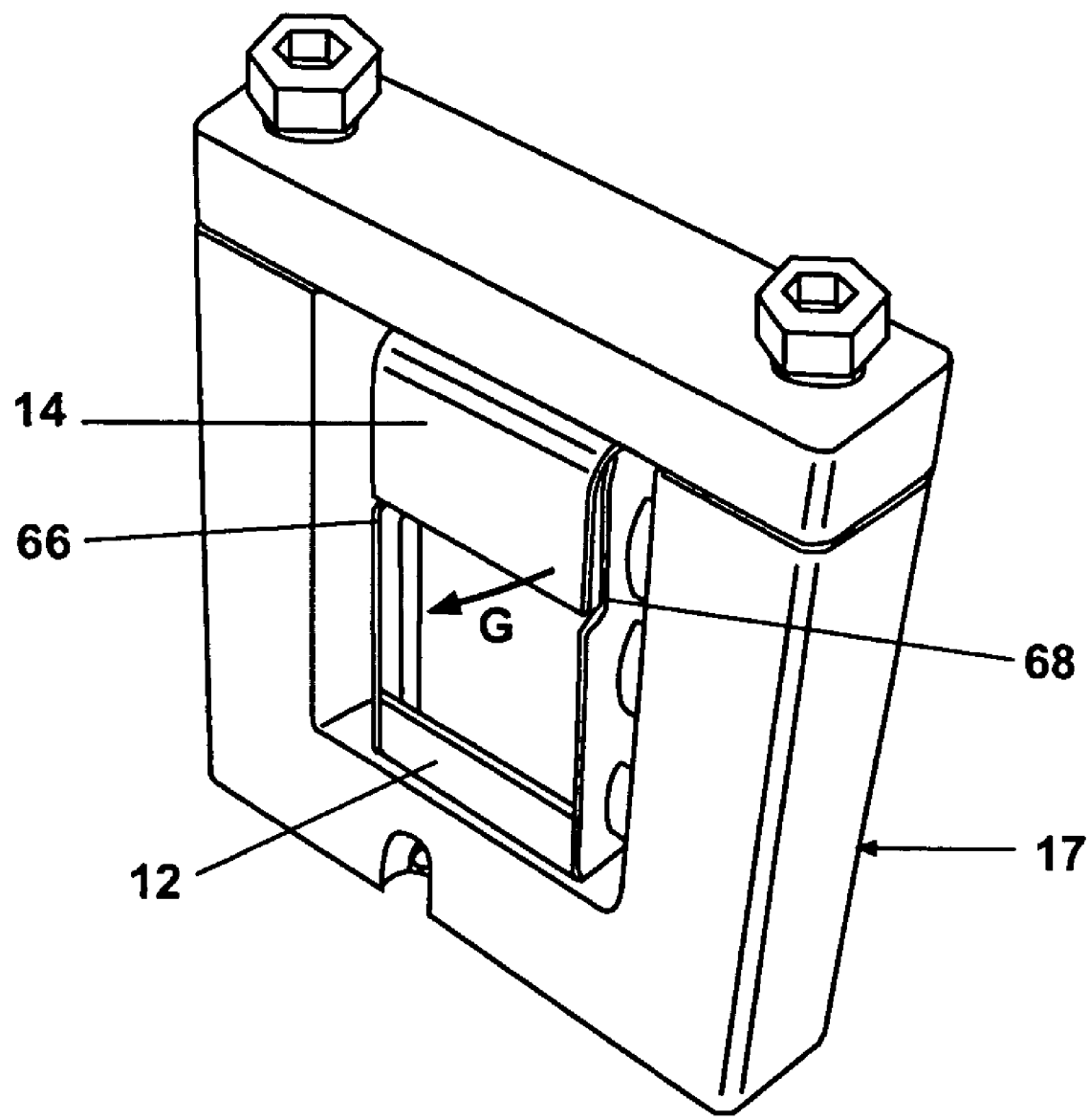
FIG. 5 is a perspective view showing the clamping frame following insertion through both the first and second flexible roller assembly and showing the flexible circuits in a partially formed condition.

Referring generally to FIG. 5, following bending of second flexible circuit 14 and, upon removing clamping frame 17 from second flexible roller assembly 40, a normal amount of spring-back of either or both of first and second flexible circuits 12, 14 can occur. This spring-back occurs in a spring-back direction "G". In the example shown, second flexible circuit 14 is not fully formed in its desired final geometry because second flexible circuit 14 has not obtained the finished shape of each of mandrel first and second shaping surfaces 66, 68.

Figure 6:
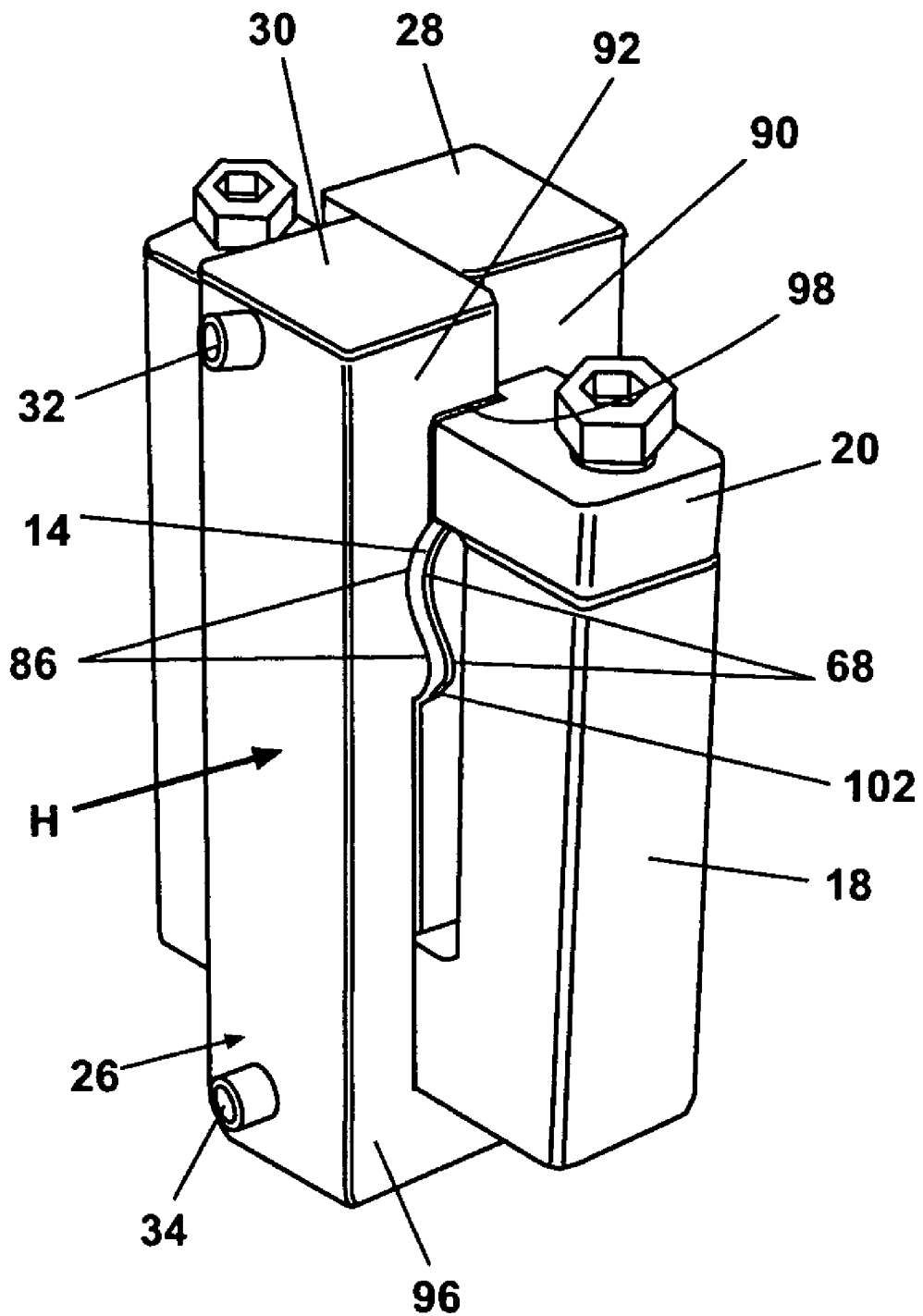
FIG. 6 is a perspective view showing installation of a curing clamp following the process step shown in FIG. 5.
Figure 7:
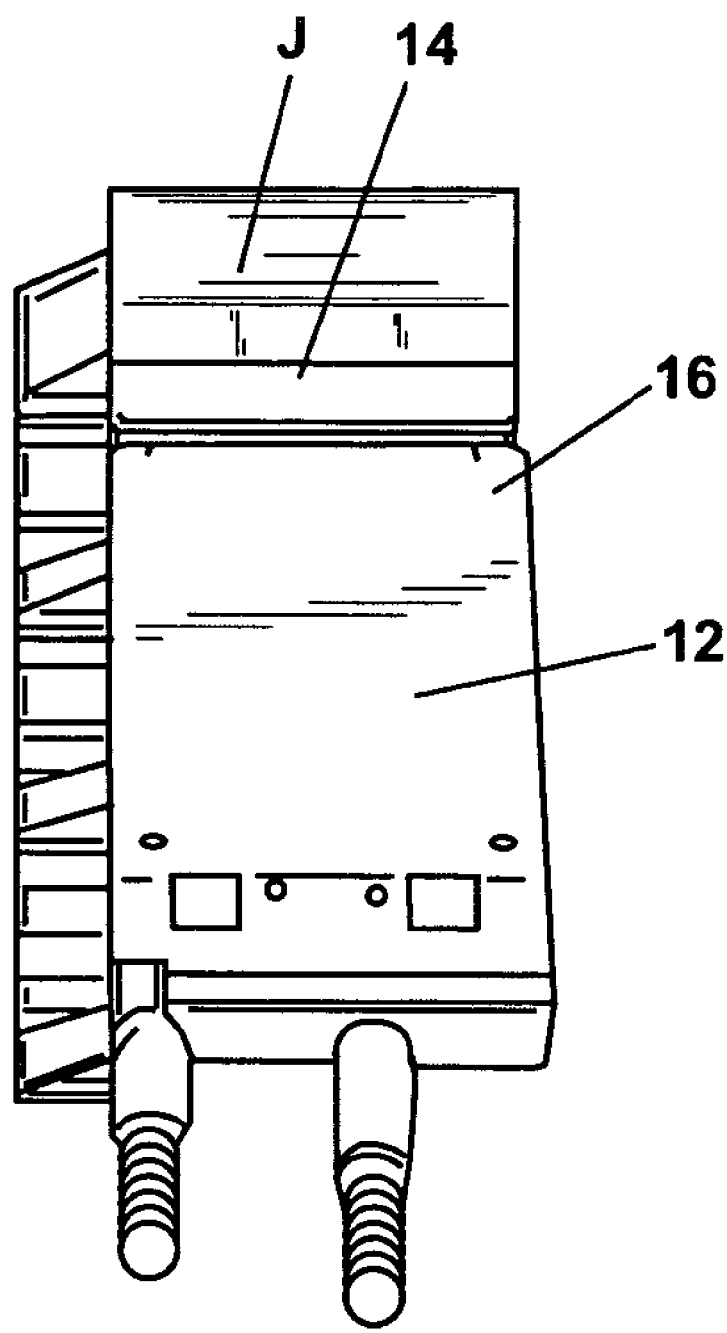
FIG. 7 is a perspective view showing a completed assembly of flexible circuits formed about a mandrel of the present invention.

Referring generally to FIG. 6, to overcome the spring-back and provide the finished shape of first and/or second flexible circuits 12 and 14, curing clamp 26 is connected to mandrel 16 about clamping frame 17 as shown. Curing clamp 26 includes opposed overlapping ends 90, 92 of each of first and second members 28, 30. At opposed ends of each of first and second members 28, 30 another pair of opposed overlapping ends 94, 96 are provided. A clearance gap 98 is preferably provided between the overlapping ends of first and second members 28, 30 and clamping frame 17. This helps ensure that a finished form 100, machined or otherwise provided on each of first and second members 28, 30, contacts first and second flexible circuits 12, 14 before curing clamp 26 contacts clamping frame 17. Clamping force in a clamping direction "H" is provided by tightening each of first and second curing clamp fasteners 32, 34.

The assembly shown in FIG. 6 is then placed in an oven or autoclave for a controlled period of time at elevated temperature until a conductive adhesive 102 which was previously applied to mandrel facing surfaces of first and second flexible circuits 12, 14 thermally bonds first and second flexible circuits 12, 14 to mandrel 16. In one preferred embodiment of the present invention, conductive adhesive 102 is a B-stage conductive epoxy which is screened onto each of first and second flexible circuits 12, 14. The B-stage epoxy is used to provide a semi-soft or semi-malleable condition for conductive adhesive 102. The assembly shown in FIG. 6 is placed in the oven at approximately 150° Celsius for approximately one hour to thermally bond each of first and second flexible circuits 12, 14 to mandrel 16. The material of curing clamp 26 is preferably the same as the material of mandrel 16 so that during the curing process both the curing clamp 26 and the mandrel 16 expand and/or contract evenly, which helps to maintain an even pressure across first and/or second flexible circuits 12, 14 to promote bonding of the flexible circuit(s) to mandrel 16. Using the same material matches a coefficient of thermal expansion between the curing clamp 26 and the mandrel 16.

After removal from the oven, curing clamp 26 is removed and mandrel 16 with bonded first and second flexible circuits 12, 14 is allowed to cool. Mandrel 16 is then removed from clamping frame 17 by removal of each of first and second clamp fasteners 22, 24 and clamping bar 20. Fasteners connected to either or both of mounting pins 70 are then removed to complete the disassembly of mandrel 16 from U-shaped clamping member 18.

A flexible circuit forming apparatus 10 of the present invention is capable of forming flexible circuits for use in electrical devices operating over a frequency range of the radio frequency band at least up to approximately 50 gigahertz applications. Previous flexible circuits known in the art when bent to a specific radius resulted in cracking of the polymeric base material and/or the metallization circuitry. This is particularly undesirable in high frequency applications where cracking induced signal loss is unacceptable. By using a fluoropolymer material for first and second flexible circuits 12, 14 and bending using the flexible circuit forming apparatus 10 of the present invention, bend radii ranging from approximately 0.015 cm (0.03 in) to approximately 0.043 cm (0.110 in) can be obtained for flexible circuits operable at least up to frequencies of approximately 50 gigahertz. Even higher operating frequencies should be possible as materials for flexible circuits 12,14 improve, for example, by use of liquid crystal polymer materials. The combination of biasing force from the various biasing elements of first and second flexible roller assemblies 38, 40 as well as the use of flexible material for each of the flexible rollers of the present invention maintains constant pressure during the bending phase of first and second flexible circuits 12,14 to reduce the likelihood of cracking or damage to the flexible circuits. Also, through the use of the flexible rollers of the present invention, the first and second flexible circuits 12, 14 do not contact metal during the bending process. This further reduces the likelihood of damage to first or second flexible circuits 12, 14. Although the use of a fluoropolymer material as a base material for first and second flexible circuits 12, 14 has been found to be of particular benefit, alternate materials for first and second flexible circuits 12,14 can also be used.

Flexible circuits formed according to the processes of the present invention can be used for electronic devices which range in frequency over the X, Ku, K and Ka frequency bands. Known flexible circuits are generally used for direct current applications and very low frequency wherein some cracking of the flexible circuits is allowable. At the much higher frequencies obtainable for use by the flexible circuit forming apparatus 10 of the present invention, defects such as cracking are substantially reduced or eliminated.

To achieve the above noted bend radii, a diameter of the flexible rollers ranges from approximately 0.098 cm (0.250 in) to approximately 0.17 cm (0.445 in). The spring force of biasing elements 62,64,82 and/or 84 maintain a continuous bending force during the bending operation. In another preferred embodiment of the present invention, mandrel 16 and first and second flexible circuits 12, 14 are preheated to approximately 66° Celsius (150° F.) prior to inserting them into clamping frame 17. This preheat softens the conductive adhesive 102 to promote better bond formation.

An apparatus and method for forming and bonding of flexible circuits to metal structures of the present invention provides several advantages. By rolling and clamping rather than sharp bending an adhesively backed flexible circuit to the metal structure, a repeatable and accurate bond can be formed. By closely controlling a shape of the clamp and a receiving flexible roller fixture, the bending radius of the flexible circuit is controlled to reduce cracking. By using flexible material for rollers of the roller fixture, a continuous pressure is applied to the flexible circuits during bending, which allows inner radius compression and outer radius stretching of the flexible circuits without damaging the flexible circuit. A clamp frame of the present invention having a predefined or finished shape of the metal structure formed thereon eliminates spring-back of the flexible circuit following bending by the roller fixture and holds the flexible circuit against the metal structure during a subsequent heat curing process to improve the bond of the flexible circuit to the metal structure.

While various preferred embodiments have been described, those skilled in the art will recognize modifications or variations which might be made without departing from the inventive concept. For example, a cam device or a withdrawing force can be used which forces the first and second flexible rollers away from each other following the bending operation(s), so biasing force is not applied to the flexible circuit(s) as they are being withdrawn from flexible circuit forming apparatus 10. Materials for the clamping frame 17 and clamping member 18 can be any materials suitable for the thermal bonding heat treatment temperature applied. Automatic rather than manual insertion of clamping frame 17 can also be used. The examples illustrate the invention and are not intended to limit it. Therefore, the description and claims should be interpreted liberally with only such limitation as is necessary in view of the pertinent prior art.

What is claimed is:

1. A method for using a device to conform and bond at least one flexible circuit having an adhesive applied to one face thereof to a metal structure, the device having a clamping frame and at least one flexible roller fixture, the method comprising:
   clamping both the metal structure and a first flexible circuit into the clamping frame such that the adhesive is oriented toward the metal structure;
   inserting a first end of the clamping frame through the flexible roller fixture to comform the first flexible circuit to the metal structure;
   removing the clamping frame having the metal structure and the first flexible circuit conformed thereto from the flexible roller fixture; and
   heat curing the adhesive between the first flexible circuit and the metal structure to adhesively bond the flexible circuit to the metal structure.

2. The method of claim 1, further comprising mounting a second flexible circuit into the clamping frame oppositely positioned across the metal structure from the first flexible circuit.

3. The method of claim 2, further comprising:
   aligning a second end of the clamping frame with a second flexible roller fixture; and
   inserting the second end of the clamping frame through the second flexible roller fixture.

4. The method of claim 1, further comprising removably fastening first and second portions of the clamping frame together during the clamping step.

5. The method of claim 4, further comprising configuring the first portion of the clamping frame as a substantially U-shaped member and the second portion as a bar operable to span distal ends of the U-shaped member.

6. The method of claim 1, further comprising rotating a plurality of opposed flexible rollers operably mounted on the flexible roller fixture operable to deflect the first flexible circuit during the inserting step.

7. The method of claim 1, further comprising connecting a curing clamp operable to define a finished flexible circuit shape to the clamping frame prior to the heat curing step.

8. The method of claim 1, further comprising fastenably connecting both the metal structure and the first flexible circuit to the clamping frame.

9. A method for using a fixture to conform and bond at least one flexible circuit to an electronic module, the fixture having a clamping frame, first and second flexible roller fixtures, and at least one curing clamp, the method comprising:
- clamping both the electronic module and the flexible circuit into the clamping frame;
- inserting a first end of the clamping frame through the first flexible roller fixture to comform the first flexible circuit to the metal structure;
- sliding a second end of the clamping frame into the second flexible roller fixture;
- connecting the curing clamp to the clamping frame; and
- heat curing an adhesive between the flexible circuit and the electronic module to adhesively bond the flexible circuit to the electronic module.

10. The method of claim 9, further comprising applying the adhesive to a first side of the flexible circuit prior to the clamping step.

11. The method of claim 10, further comprising orienting the flexible circuit with respect to the electronic module such that the first side of the flexible circuit having the adhesive faces the electronic module during the clamping step.

12. The method of claim 9, further comprising installing a plurality of opposed flexible rollers on each of the first and second flex roller fixtures.

13. The method of claim 12, further comprising biasing each of the opposed flexible rollers toward each other in each of the first and second flex roller fixtures.

14. The method of claim 9, further comprising creating a pattern defining a desired finished shape of the flexible circuit on the curing clamp.

15. The method of claim 9, further comprising removing the first end of the clamping frame from the first flexible roller fixture prior to the sliding step.

16. The method of claim 9, further comprising removing the second end of the clamping frame from the second flexible roller fixture prior to the connecting step.

* * * * *